United States Patent [19]

Murai et al.

[11] Patent Number: 5,443,888
[45] Date of Patent: Aug. 22, 1995

[54] MAGNETIC RECORDING MEDIUM HAVING A CARBON PROTECTIVE LAYER AND PARTIALLY FLUORINATED ALKYL CARBOXYLIC ACID LUBRICANT LAYER

[75] Inventors: Mikio Murai, Hirakata; Kiyoshi Takahashi, Ibaraki; Masaru Odagiri, Kawanishi; Yoshiaki Kai, Neyagawa; Takashi Suzuki, Takatsuki; Toshiaki Kunieda, Mino, all of Japan

[73] Assignee: Matsushita Electric Industrial Co., Ltd., Kadoma, Japan

[21] Appl. No.: 174,685

[22] Filed: Dec. 28, 1993

Related U.S. Application Data

[60] Continuation of Ser. No. 956,106, Oct. 2, 1992, abandoned, which is a division of Ser. No. 621,464, Dec. 3, 1990, Pat. No. 5,182,132.

[30] Foreign Application Priority Data

Dec. 11, 1989 [JP] Japan .................. 1-321698

[51] Int. Cl.$^6$ .............................................. G11B 5/00
[52] U.S. Cl. ........................... 428/143; 428/408; 428/457; 428/694 TC; 428/694 TS; 428/694 TR; 428/694 TF; 428/694 TP; 428/900
[58] Field of Search ........ 428/694, 408, 695, 900, 428/694 TC, 694 TS, 694 TR, 694 TF, 694 TP, 457, 143

[56] References Cited

U.S. PATENT DOCUMENTS

| | | | |
|---|---|---|---|
| 4,539,266 | 9/1985 | Miyazaki | 428/695 |
| 4,645,977 | 2/1987 | Kurokawa et al. | 315/111.21 |
| 4,717,622 | 1/1988 | Kurokawa et al. | 428/408 |
| 4,735,848 | 4/1988 | Kondo et al. | 428/219 |
| 4,797,321 | 1/1989 | Funahashi et al. | 428/328 |
| 4,833,031 | 5/1989 | Kurokawa et al. | 428/336 |
| 4,833,032 | 5/1989 | Reese | 428/364 |
| 4,880,687 | 11/1989 | Yokoyama et al. | 428/141 |
| 4,910,068 | 3/1990 | Takagi et al. | 428/141 |
| 5,015,494 | 5/1991 | Yamazaki | 427/39 |
| 5,069,973 | 12/1991 | Saito et al. | 428/421 |
| 5,110,676 | 5/1992 | Murai et al. | 428/336 |
| 5,275,850 | 1/1994 | Kitoh et al. | 427/577 |

FOREIGN PATENT DOCUMENTS

| | | |
|---|---|---|
| 194675 | 9/1986 | European Pat. Off. |
| 239028 | 9/1987 | European Pat. Off. |
| 50-104602 | 8/1975 | Japan |

OTHER PUBLICATIONS

Japanese Patents Gazette Section CH: Chemical, Week 8539, Derwent Publications Ltd. London GB, Nov. 6, 1985, Class L, p. 42 No. J60157725/A.

*Primary Examiner*—Stevan A. Resan
*Attorney, Agent, or Firm*—Cushman, Darby & Cushman

[57] ABSTRACT

In making a magnetic recording medium, a diamond-like carbon film is formed stably with high product efficiency such as 200 Å/sec, without occurrence of irregular discharge, and improved still durability and reduced head contamination are achieved by utilizing a.c. plasma discharge or a.c. plasma discharge superimposed by d.c. power and the lubricant film.

1 Claim, 9 Drawing Sheets

○:The diamond like carbon film obtained by the conventional d.c. plasma method
●:The diamond like carbon film obtained by the present invention

FIG. 4

● Data obtained by applying only a.c. voltage

○ Data obtained by applying a.c. voltage superimposed by d.c. voltage in the condition of R*=50% (*R is defined in FIG.5)

MAGNETIC RECORDING MEDIUM HAVING A CARBON PROTECTIVE LAYER AND PARTIALLY FLUORINATED ALKYL CARBOXYLIC ACID LUBRICANT LAYER

This is a continuation of application Ser. No. 07/956,106, filed on Oct. 2, 1992, which was abandoned upon the filing hereof; which was a division of Ser. No. 07/612,464 filed Dec. 3, 1990 now U.S. Pat. No. 5,182,132.

FIELD OF THE INVENTION AND RELATED ART STATEMENT

1. Field of the Invention

The present invention relates to magnetic recording medium (e.g. magnetic tape, magnetic disk or floppy disk) having thin film of ferromagnetic metal as magnetic recording film and hard protective film thereon, and relates to method for making it.

2. Description of the Related Art

It is required to protect the magnetic recording film as the magnetic recording medium, which has thin film of ferromagnetic metal as magnetic recording film, from damages by contacting a moving magnetic heads. Concretely, this requirement means necessity of good still durability (durability at a use state where tape is stopped still and heads only run on the tape) and stable output in running as a magnetic tape, and of good C.S.S.(Contact Start Stop) characteristic as a magnetic disc or a floppy disk.

In order to obtain the above-mentioned good characteristics, a ferromagnetic metal film having lubricant film made of carboxylic acid thereon is disclosed in U.S. Pat. No. 4,539,266. A ferromagnetic metal film having nonmagnetic protection film made of $SiO_2$ or the like thereon is disclosed in the Japanese published unexamined patent application Tokkai Sho 50-104602. The ferromagnetic metal film having a combined protective film of both a diamond-like carbon film and a lubricant film thereon is shown in commonly assigned U.S. Pat. No. 4,833,032 to KUROKAWA et al. As to the method for making the diamond-like carbon film, a conventional d.c. plasma CVD method is disclosed in commonly assigned U.S. Pat. No. 4,645,977 to KUROKAWA et al.

But small deposition rate of 20 Å/sec of the diamond-like carbon film is shown in the method disclosed in the above-mentioned U.S. Pat. No. 4,645,977 wherein methane is used as a carbon source. This deposition rate is a first problem as to making the diamond-like carbon film with high productive efficiency. In order to obtain large deposition rate, even if hydrocarbon having much carbon atoms e.g. propane or octane is used instead of methane, the deposition rate is improved to 60 Å/see, but enough hardness of the diamond-like carbon film is not obtained, which leads to reduce still durability. Thus, it has been hard to obtain both good still durability and high productive efficiency.

Figure 6:
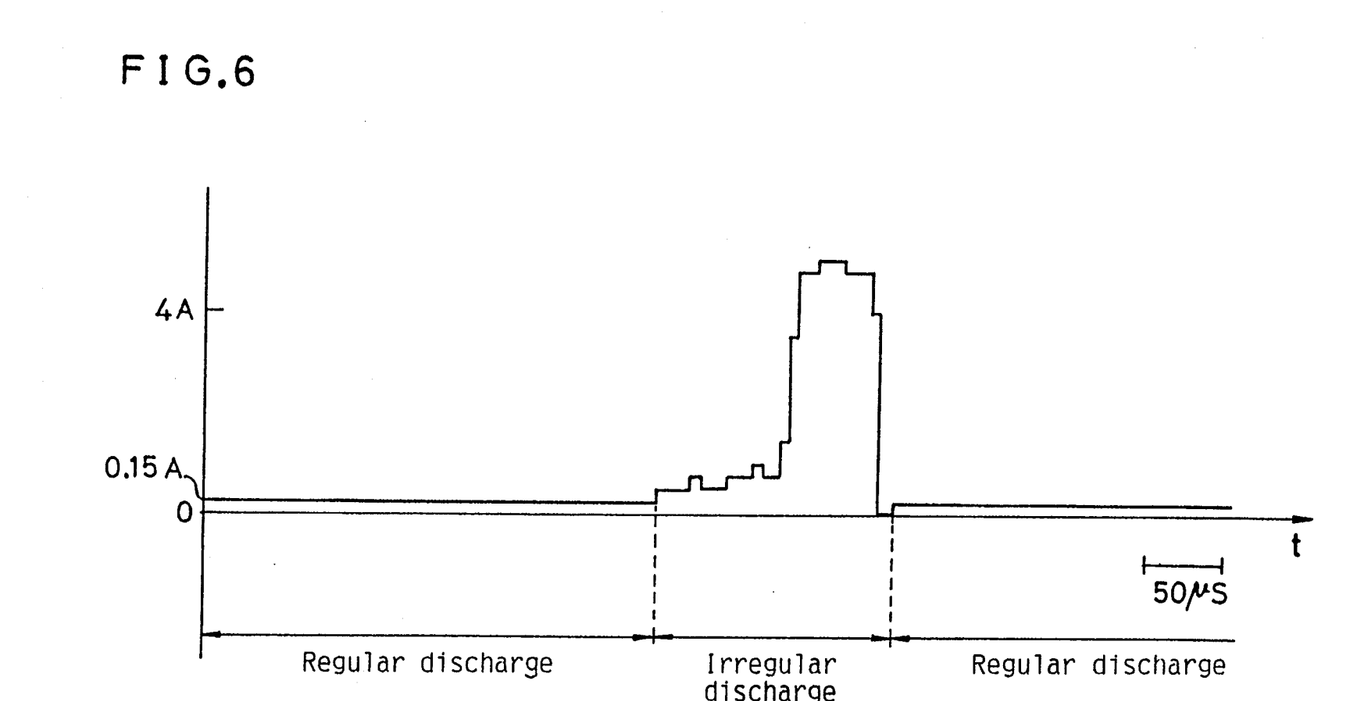
FIG. 6 is a graph showing a waveform of the irregular discharge observed on d.c. power line of the conventional d.c. plasma discharge.

Furthermore in the method disclosed in the U.S. Pat. No. 4,645,977, it is observed that a phenomenon of irregular discharge takes place. That is, a current larger than a constant current flows in a process of forming the film in plasma discharging. This phenomenon leaves zigzag shaped trace of the irregular discharge on the thin film of ferromagnetic metal, and this trace is a fatal fault as the recording medium because the part of zigzag shaped trace part can not reproduce signal. FIG. 6 is a diagram showing a waveform of the irregular discharge observed on d.c. power line of the conventional d.c. plasma discharge. This undesirable occurrence (generation) of the irregular discharge is a second problem as to making the diamond-like carbon film.

In order to overcome the above-mentioned problem, further improvement is necessary in making the diamond-like carbon film.

Significantly improved still durability is shown in the combined protective film having a diamond-like carbon film and a lubricant film thereon disclosed by U.S. Pat. No. 4,645,977 to Kurokawa et al. Though the use of lubricant (film) will lead to good durability, undesirable head contamination after running of the tape or the disk, which leads to bad results on magnetic recording/playing-back or writing/reading by head. That is, lubricant is necessary for improved still durability but is main cause of head contamination.

The combined protective film of the diamond-like carbon film and the lubricant film shows good characteristics in the above-mentioned requirement. But the magnetic recording medium having more improved characteristic as to still durability and head contamination and a method for making it with high productive efficiency are required.

OBJECT AND SUMMARY OF THE INVENTION

The purpose of the present invention is to provide a method for making a magnetic recording medium having protective films of a diamond-like carbon film having no-defect and a lubricant film formed thereon, which provide more improved still durability, reduced head contamination and high production efficiency.

These objects are accomplished by a method for making a magnetic recording medium comprising the steps of:

forming a ferromagnetic metal thin film on a substrate, forming a plasma polymer film on the ferromagnetic metal thin film, forming a diamond-like carbon film on the plasma polymer film by plasma CVD method utilizing a.c. power in the frequency range of 80 Hz to 200 kHz which has peak voltage more than +500 V and hydrocarbon having at least 3 carbon atoms as material, and forming lubricant film on the diamond-like carbon film by a coater or an organic deposition method.

By the method for making the magnetic recording medium the diamond-like carbon film which is harder and more durable than one obtained by the conventional d.c. plasma method is obtained stably with high product efficiency, and further both improved still durability and reduced head contamination are achieved.

While the novel features of the invention are set forth particularly in the appended claims, the invention, both as to organization and content, will be better understood and appreciated, along with other objects and features thereof, from the following detailed description taken in conjunction with the drawings.

It will be recognized that some or all of the Figures are schematic representations for purposes of illustration and do not necessarily depict the actual relative sizes or locations of the elements shown.

DESCRIPTION OF THE PREFERRED EMBODIMENTS

Hereafter, preferred embodiments of the present invention are explained with reference to the accompanying drawings.

Figure 1:
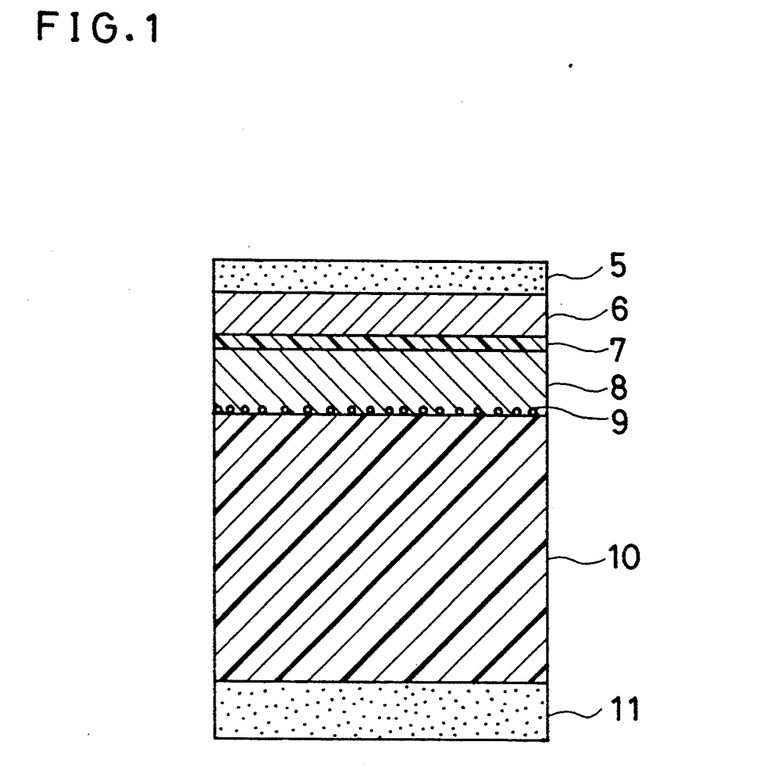
FIG. 1 is a sectional view showing a magnetic recording medium (tape) embodying the present invention.

[1] Improvement of still durability by to hard diamond-like carbon film:

FIG. 1 is a sectional view showing a magnetic recording medium embodying tile present invention. In FIG. 1, a ferromagnetic metal thin film 8 is formed on a protrusion layer 9 of a substrate 10. A plasma polymer film 7, a diamond-like carbon film 6 and a lubricant film 5 are formed thereon in order. A back coat film 11 is formed on a back surface of the substrate 10.

Conventionally, the diamond-like carbon film 6 has been formed by a d.c. plasma CVD method in the following condition:

pressure in a discharge tube is 0.3 Torr., and
mixed gas of methane of 0.25 Torr with argon of 0.05 torr is used as source material.

In the discharge of d.c. plasma, the constant voltage selected from +800 V to +4000 V has been applied across an electrode of the discharge tube and the ferromagnetic metal thin film. In such conventional method, as the applied voltage increases, hardness of the diamond-like carbon film increases, but, increase of hardness is saturated shortly at a relatively low level. Thereby it has been impossible to greatly raise hardness of the diamond-like carbon film. Further, in tile conventional method, forming of the diamond-like carbon film necessarily has induced an irregular discharge, and the deposition rate thereof has been so low as only 20 Å/sec.

According to the embodiment of tile present invention, the diamond-like carbon film, which is harder and more durable than the one formed by tile conventional d.c. plasma method, can be obtained stably at a high deposition rate, which is suitable for mass production. Mixed gas of saturated or unsaturated hydrocarbons having at least 3 carbon atoms e.g. isooctane, propane, etc. with a small amount of argon is used as material gas, and plasma discharge is carried out in the frequency range of 80 Hz to 200 KHz of a.c. power having a peak voltage of more than +500 V at 0.3 Torr of pressure in the discharge tube. A material in liquid state at the room temperature e.g. isooctane is introduced into a chamber under a reduced pressure at an increased temperature. The diamond-like carbon film in accordance with the present invention having increased hardness can considerably improve the still durability.

During plasma discharge, which is made similarly in the frequency range of 80 Hz to 200 KHz of a.c. power with the peak voltage of more than 500 V e.g. 4000 V, a further d.c. voltage from 1000 V to 2500 V is superimposed thereto. It is observed that, also in this condition of plasma discharge, a hard diamond-like carbon film 6 can be obtained stably and at a high deposition rate which is suitable for mass production.

Figure 3:
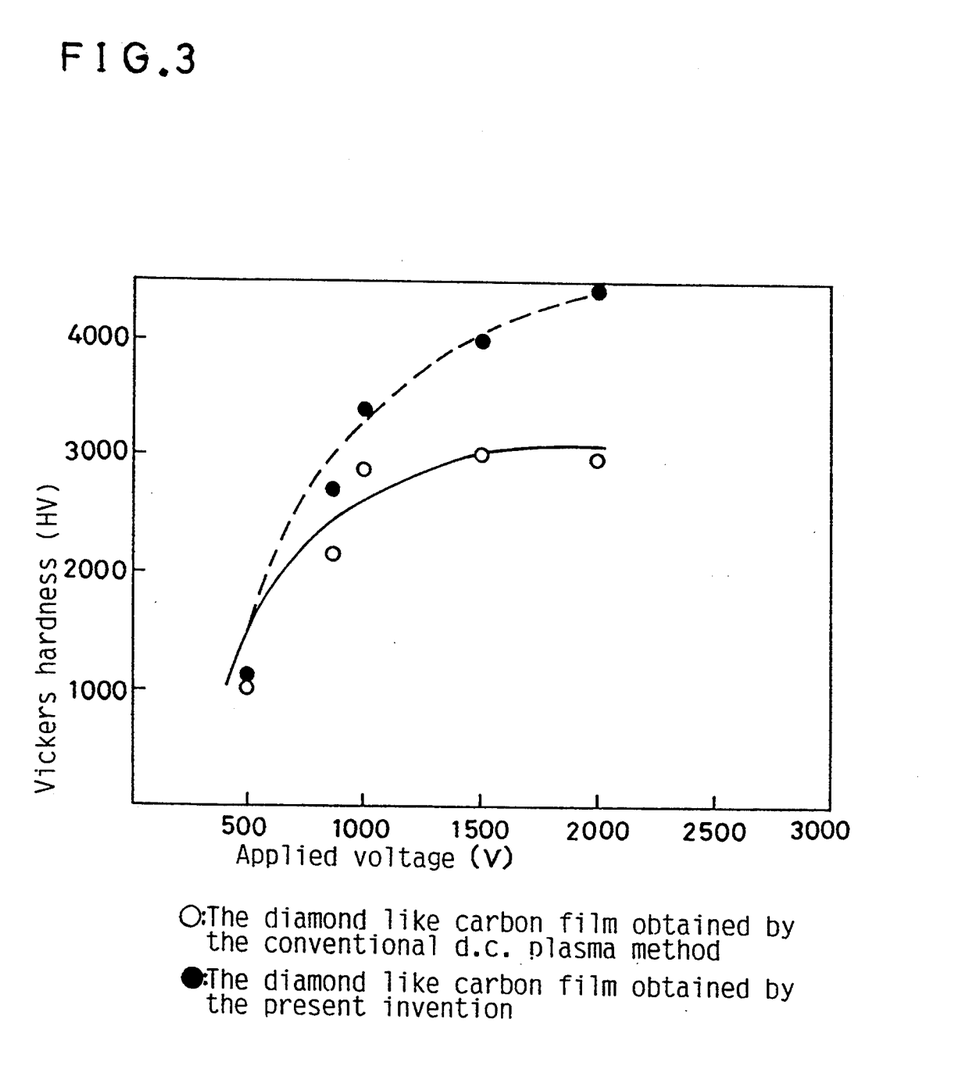
FIG. 3 is a diagram showing a relation of Vickers hardness (HV) with the applied d.c. voltage of the conventional d.c. plasma CVD method and a relation of that with the applied a.c. voltage of the method of the present invention.

By the way of comparison, hardness of the respective diamond-like carbon films formed on silicon wafer by the conventional DC plasma method and by the method of the present invention were measured by the micro Vickers method. FIG. 3 is a diagram showing a relation of Vickers hardness (HV) with the applied d.c. voltage of the conventional d.c. plasma CVD method and a relation of that with the applied a.c. voltage of the method of the present invention. And the frequency of the a.c. power was 20 kHz. In case of the conventional DC plasma method, even by using higher d.c. voltage, the hardness of the diamond-like carbon film can not be released over 2700 kg/mm$^2$ Vickers hardness. In contrast, the diamond-like carbon film formed by the method of the present invention shows 3000–3500 kg/mm$^2$ Vickers hardness constantly.

Next, experimental results are shown as to a still durability which shows a direct or practical characteristic for evaluation, rather than the above-mentioned micro vickers hardness which is an indirect characteristic for evaluation.

Figure 4:
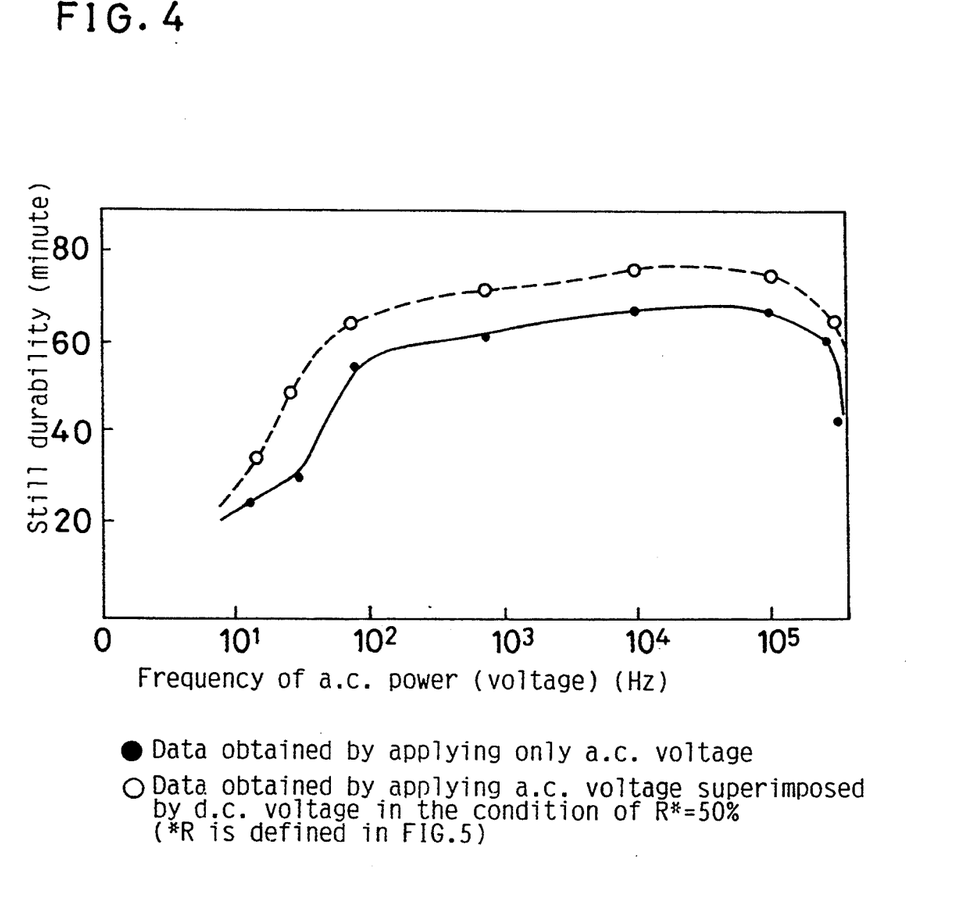
FIG. 4 is a diagram showing a relation between the frequency of the a.c. power (voltage) with the still durability.

FIG. 4 is a diagram showing a relation between the frequency of the a.c. power with the still durability, which is defined by a period till an output decreases by 3 dB in pause (still picture reproducing) mode, and the period is measured by using a commercial product VTR of type MII manufactured by Matsushita Electric Industrial Co., Ltd. of Japan under condition of an atmosphere of 23° C. 10% relative humidity (RH: hereinafter).

Data shown in FIG. 4 are obtained in the following condition:

the applied peak voltage is 2500 V, and
pressure of introduced material gas is 0.3 Torr.

Frequency dependency of the still durability does not change from that of FIG. 4, even when kind of material gas is changed, the applied peak voltage is changed from 500 V to 4000 V and/or the pressure of introduced material gas is changed from 0.05 Torr to 0.8 Torr.

Some irregular discharge have been found in the conventional plasma discharge methods e.g. d.c. plasma discharge for making the diamond-like carbon film. Even in a PI-CVD (plasma-injection chemical vapor deposition) method wherein only d.c. voltage is applied to the plasma discharge tube and radio frequency of 13.56 MHz electromagnetic wave is applied from outside the discharge tube, or in another PI-CVD method without application of radio frequency electromagnetic wave, the irregular discharge occurs necessarily. These conventional PI-CVD method are disclosed in the U.S. Pat. No. 4,645,977. FIG. 6 is a diagram showing a waveform of tile irregular discharge observed on d.c. power line of the conventional d.c. plasma discharge. In the present invention which utilizing only a.c. power in the frequency range of 80 Hz to 200 KHz or a.c. power in the same frequency range superimposed by d.c. power to a certain extent (which is elucidated later), plasma discharge is always carried out without the irregular discharge. It results no deterioration in quality of reproduced signal or data as a magnetic recording medium.

Further, in case isooctane gas is used in the present invention, the deposition rate of the diamond-like carbon film becomes 80 Å/sec which is 4 times as large as the deposition rate of methane. In case benzene, toluene, or 2,3-dimethyl-1,3-butadiene is used, the deposition rate becomes from 180 Å/sec to 200 Å/sec, which is almost as 10 times large as the deposition rate of methane and is large enough for mass production of the diamond-like carbon film. Furthermore, enough hardness of the diamond-like carbon film has been maintained even at such large deposition rate.

Table 1 shows the above-mentioned result.

As a result, we found that in case where either the following composition A or B is used as the lubricant film, it enables both improvement in still durability and reduction of head contamination.

Composition A:
Partially fluorinated ester of alkyl carboxylic acid having a melting point below 5° C. expressed by the chemical formula;

Rf—R—COO—R'  (1) or

Rf—R—COO—Rf'  (2).

Composition B:
Partially fluorinated alkyl carboxylic acid having a melting point from 50° C. to 90° C. expressed by the chemical formula;

RF—R—COOH  (3).

In the formulas (1), (2) and (3), each "Rf" and "Rf'"

TABLE 1

| Example No. | Applied power a. c. voltage frequency | d. c. voltage | Carbon source (hydrocarbon) | Inert gas | Depositin rate (Å/s) | Still durability (minutes) 20° C., 10% RH | 5° C., 80% RH |
|---|---|---|---|---|---|---|---|
| 1*1 | — | 800 V | Methane | Argon*2 | 20 | 30 | 20 |
| 2*1 | — | 1000 V | Methane | Argon*2 | 20 | 40 | 30 |
| 3*1 | — | 1400 V | Isooctane | Argon*2 | 40 | 50 | 30 |
| 4 | 1000 V 120 kHz | — | Isooctane | Argon*2 | 80 | 80 | 30 |
| 5 | 1000 V 1 kHz | — | Hexane | Aragon*2 | 60 | 100 | 50 |
| 6 | 3000 V 80 Hz | 1000 V | Isooctane | Argon*2 | 100 | 150 | 60 |
| 7 | 4000 V 30 kHz | 2000 V | 2,3 dimethyle 1,3 butadiene | Argon*2 | 180 | 150 | 60 |
| 8 | 3000 V 20 kHz | 2000 V | Benezene | Argon*2 | 180 | 140 | 60 |
| 9 | 4000 V 5 kHz | — | Issoctane | — | 70 | 90 | 50 |
| 10 | 3000 V 80 kHz | 1500 V | Hexane | — | 80 | 100 | 60 |

Notes:
*1Examples No. 1, No. 2 and No. 3 are comparison examples as to the conventional d. c. CVD method.
*2The ratio of argon to hydrocarbon is 1:4.

[2] Improvement of still durability and reduction of dust stuck on head (after running test):

Since the surface of the magnetic recording medium is worn due to contact with the magnetic head, fine powder of the magnetic recording material (which is magnetic powder) and back coat film material (which is of the material of back coat layer) are produced. Thus, dust of magnetic powder stuck on the head is made, and the back coat powder is hardened by kneading with a lubricant and results "head contamination". We have found that the amount of dust stuck on head is influenced by a melt viscosity of lubricant at the temperature which is higher than ambient temperature by about 15° C. The higher the melt viscosity is, the larger the amount of dust stuck on head becomes. So we conjecture that a liquid material having a low melt viscosity in the working temperature from about 5° C. to about 40° C., or solid material which is hardly melt in the working temperature is suitable for the lubricant, in order to reduce the amount of dust stuck on head.

It has been required conventionally that the lubricant has a molecular structure including fluorine atom(s) in order to prevent lowering of still durability due to adhesion under reduced humidity atmosphere. Thus, we made numerous experiments as to various lubricant materials including fluorine atom(s) which satisfy the above-mentioned condition as to the melt viscosity.

means a fluoro aryl end group or, saturated/unsaturated fluoro alkyl end group which has at least 3 carbon atoms and normal or branched chain. Each "R" and "R'" means a hydrocarbon comprising a phenylene group with alkylene having at least 10 carbon atoms, a derivative therefrom, or a saturated or unsaturated aliphatic alkylene group which has at least 10 carbons and normal or branched chain.

From the result of experiments, in case the melting point of the carboxylic acid expressed by the formula (3) is above 90° C., sufficient lubrication effect could not be achieved in an environment for practical use.

Some concrete examples, which were able to achieve sufficient lubrication, have the following end group as "Rf" or "Rf'":

$HCF_2(CF_2)_n$—,
$C_nF_{2n-1}$—,
$C_6F_5$— or $\begin{matrix} C_6F_5 \\ C_6F_5 \end{matrix}$ >CH—, wherein n is a natural number which is greater than or equal to 3, and the examples further have the following hydrocarbon as "R" or "R'":

$-C_nH_{2n}-$,
$-C_nH_{2n-2}-$,
$-C_nH_{2n-4}-$,
$-C_6H_4-C_nH_{2n}-$ or $-C_lH_{2l}-CH-C_mH_{2m}$,
        |
        $C_kH_{2k+1}$ wherein n is a natural number which is greater than or equal to 10, and each l, m, and k is natural number which is greater than or equal to 1.

The fluoro aryl end group or the fluoro alkyl end group is combined with the phenylene group with alkylene, the derivative therefrom or the aliphatic alkylene group directly or by the following bonding group:

$-O-$,
$-S-$ or
$-COO-$.

Hereafter, by taking example of a magnetic tape, a magnetic recording medium of the present invention is explained with reference to the accompanying drawings. And the method for making the diamond-like carbon film is also explained togetherwith. A configuration of a magnetic tape of the present invention is the as same as the configuration shown in FIG. 2.

The substrate 10 is made of polyethylene terephthalate film having 9.5 μm thickness, wherein surface roughness thereof is controlled and there is no unusual large protrusion. The protrusion layer 9 is made by a coating method which provides fine particles of $SiO_2$ having about 100 Å diameter at a rate of $10^4$–$10^8$ particles/mm$^2$ on the surface of the substrate 10. A ferromagnetic metal thin film e.g. Co(80)-Ni(20) thin film 8 is formed with 1800 Å thickness on the protrusion layer 9 by a conventional vapor deposition method at the same time that oxygen is introduced. Next a back coat film 11 (made of e.g. a composition of polyurethane, nitrocellulose and carbon) is formed with 0.5 μm thickness on the under surface of the substrate 10 by a coating method.

Then, a plasma polymer film 7 made of cyclic or normal chain hydrocarbon (e.g. per fluoro cyclobutane or isooctane) is formed on the ferromagnetic metal thin film 8 with 5 Å–20 Å thickness by plasma CVD method in the condition of 0.1 Torr pressure 15 kHz frequency, and 500 V voltage.

Figure 2A:
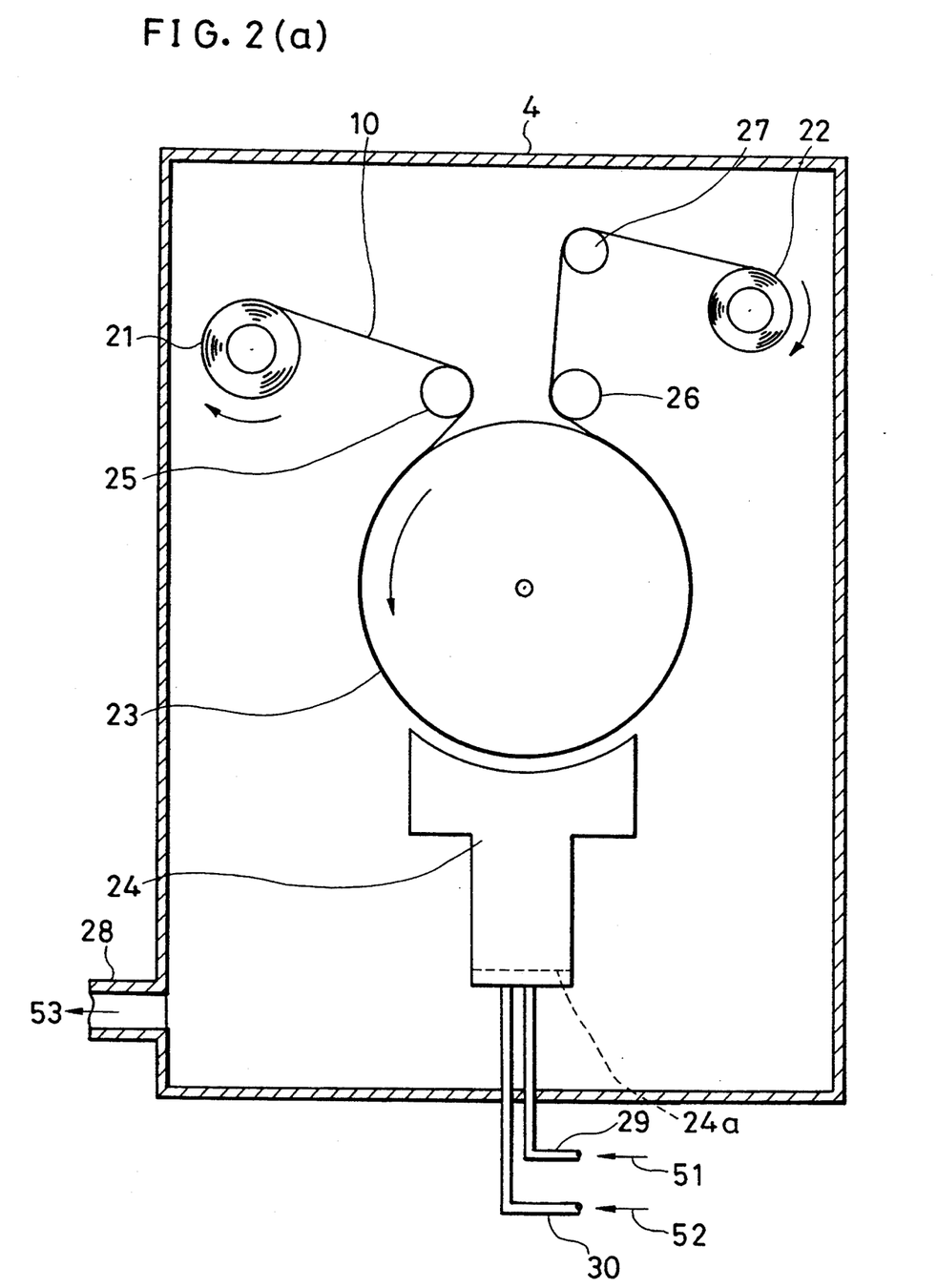
FIG. 2(a) is a side view showing an apparatus for forming the diamond-like carbon film by plasma discharge embodying the present invention.
Figure 2B:
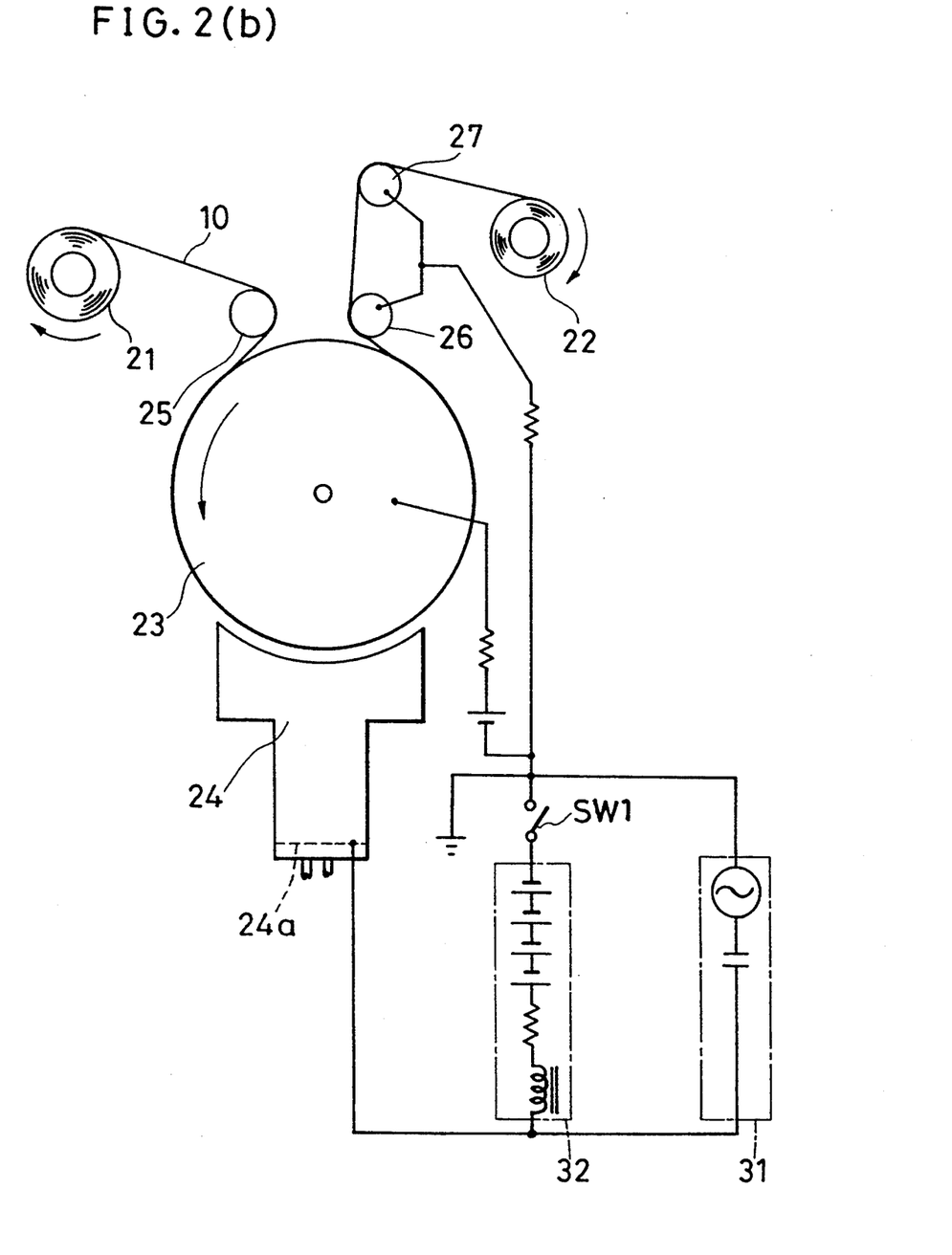
FIG. 2(b) is a circuit diagram of tile apparatus shown in FIG. 2(a).

Next, the diamond-like carbon film 6 is formed by an apparatus shown in FIGS. 2(a) and 2(b). FIG. 2(a) is a side view showing an apparatus for forming the diamond-like of carbon film by plasma discharge embodying the present invention. FIG. 2(b) is a circuit diagram of the apparatus shown is FIG. 2(a).

A chamber 4 is provided with an inlet port 30 which is used to apply a gas of hydrocarbon shown in the Table 1 as indicated by an arrow 52. Similarly, the material (hydrocarbon) in liquid state at the room temperature is applied under reduced pressure at increased temperature. An inert gas, such as argon, helium, neon, krypton, xenon, radon, etc. is supplied through an inlet port 29 as indicated by an arrow 51. These gas of hydrocarbon and inert gas are introduced in a discharge tube 24. The chamber 4 is further provided with an outlet port 28 which is used to remove applied gases, e.g. gas of hydrocarbon, inert gas from the chamber 4, as indicated by an arrow 53.

Pressure in the chamber 4 is kept at about $1 \times 10^{-4}$ Torr during plasma discharge.

The substrate 10 having the above-mentioned ferromagnetic metal thin film 8, back coat film 11 and plasma polymer film 7 rolled on a supplying reel 21 is fed out through a reel 25 and transferred on the circumference of a cylindrical can 23, wherein the diamond-like carbon film is deposited on the plasma polymer film 7 by the discharge tube 24 in transferring. After the deposition, the substrate 10 is wound up by a winding reel 22 through reels 26 and 27.

The reels 26 and 27 made of electrically conductive material having a surface resistivity in a range of $10^3$–$10^6$ Ω/cm$^2$ are grounded, so that the ferromagnetic metal thin film 8 having the diamond-like carbon film thereon which contacts the reels 26 and 27 is electrically connected to ground. Thereby an a.c. voltage Vac from an a.c. power source 31 is applied between an electrode 24a in the discharge tube 24 and the ferromagnetic metal thin film 8. In case a d.c. voltage Vdc from a d.c. power source 32 is intended to be superimposed at the a.c. voltage Vac, the d.c. voltage Vdc is added by turning on of a switch SW1 after the plasma discharge of the a.c. voltage Vac begins.

Figure 7:
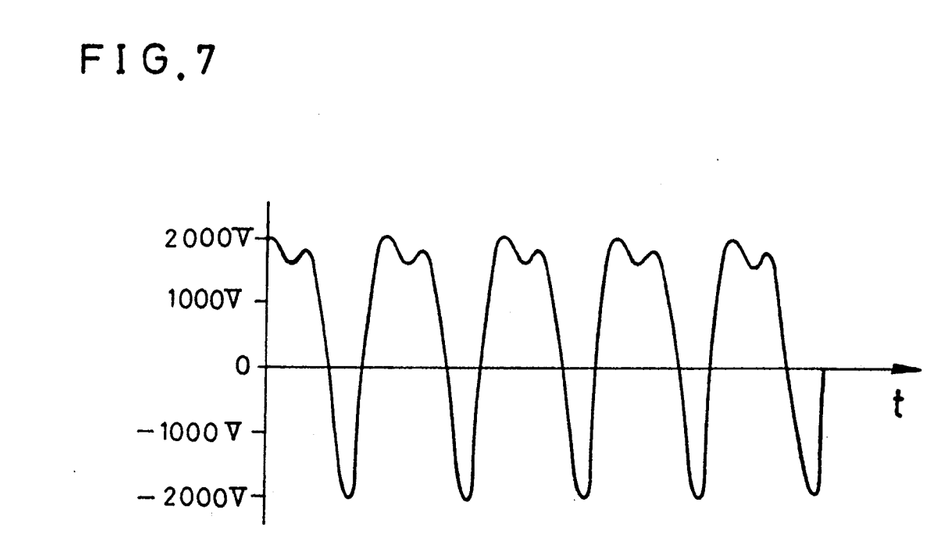
FIG. 7 is a diagram showing a waveform of the a.c. voltage Vac observed by an oscilloscope.
Figure 8:
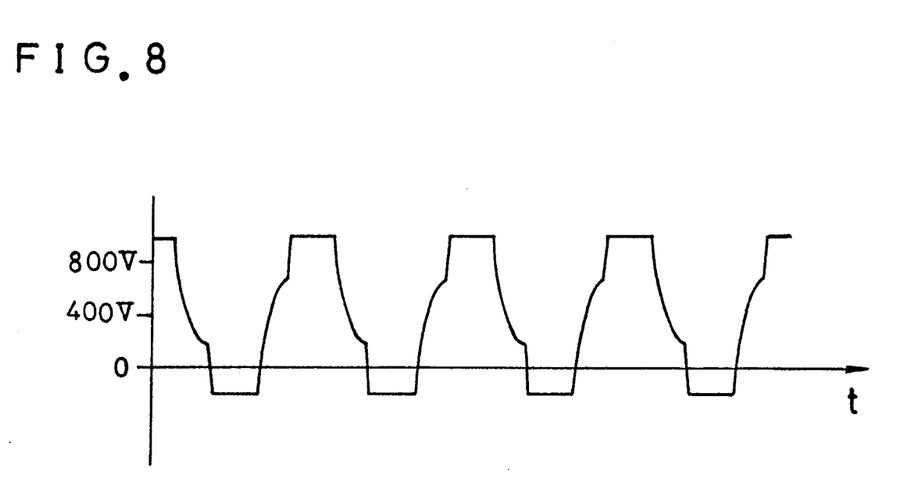
FIG. 8 is a diagram showing a waveform of the d.c. voltage Vd being superimposed on the a.c. voltage Vac observed by an oscilloscope.

The a.c. voltage Vac having peak voltage not less than +500 V e.g. +3000 V in the frequency range of 80 Hz to 200 kHz is applied by the a.c. power source 31. FIG. 7 is a diagram showing a waveform of the a.c. voltage Vac observed by an oscilloscope. The d.c. voltage Vdc from 1000 V to 2500 V is superimposed on the a.c. voltage Vac by the d.c. power source 32 according to condition as shown in Table 1. FIG. 8 is a diagram showing a waveform of the d.c. voltage Vdc being superimposed on the a.c. voltage Vac observed by an oscilloscope. Thereby the diamond-like carbon film 6 is formed from 80 Å to 160 Å thick by the plasma CVD method. The inventors made various experiments in different conditions as to kind of material gas. pressure in the discharge tube, and condition of plasma discharge (which corresponds to apply the a.c. power and/or the d.c. power). And results of important experiments obtained therefrom are shown in Table 1. From the results of the above-mentioned various experiments, the following conclusions were obtained.

The larger in the molecular weight of the hydrocarbon, the higher has to be the applied a.c. voltage Vac in order to obtain sufficient hardness.

A pressure of about 0.3 Torr in the discharge tube 24 is sufficient.

The preferable ratio of argon to hydrocarbon in the discharge tube is from 1:6 to 1:2. And when the other inert gas e.g. helium, neon, krypton, xenon, radon is used instead of argon, similar result is obtained.

From FIG. 4, the preferable frequency range of the a.c. voltage Vac is found to be from 80 Hz to 200 kHz, whether the d.c. voltage Vdc is superimposed or not. Undesirable low still durability was observed in the diamond-like carbon film obtained by applying the a.c. voltage Vac in the high frequency range over 200 kHz. The reason of the low still durability at the high frequency range is supposed that kinetic energy of ions at the time of collision with the substrate (the plasma polymer film) is reduced in such high frequency.

The diamond-like carbon films obtained from mixed group of isooctane and argon or mixed gas (system) of benzene and argon have better still durability than one obtained by the conventional d.c. plasma method as shown in Table 1 (comparison examples 1, 2 and 3).

In Table 1, still durability of each examples is tested after forming the lubricant film 5 thereon. The lubricant film 5 is formed by applying alkylcarboxylic acid including fluorine on the diamond-like carbon film 6. Wherein, the alkylcarboxylic acid including fluorine $C_6F_{11}OC_6H_4(CH_2)_{11}COOH$ dissolved in suitable solvent is applied from 20 Å to 50 Å thickness by a conventional coater, or it is deposited by a conventional organic deposition method.

Next the magnetic recording tape is cut into ½ inch VTR tapes by a slitter. The still durability of the ½ inch VTR tape is measured by the afore-mentioned MII type VTR of Matsushita Electric Industrial Co., Ltd. The still durability is defined as a period from the time of start of use of the recording medium to the time of occurrence of decrease of output by 3 dB caused by scratches on the surface of the magnetic tape, measured in pause (still) mode.

In Table 1, the examples No. 1, 2 and 8 are comparison examples which show result of the diamond-like carbon film obtained by the conventional d.c. plasma CVD method. The example Nos. 4, 5, 6, 7 and 8 show result obtained by using both carbon source (hydrocarbon) and inert gas (argon), and the example Nos. 9 and 10 show result obtained by using only carbon source (hydrocarbon).

In addition to the example No. 5, each of n-octane and n-pentane was examined as an example of normal chain saturated hydrocarbon. And it was observed that the deposition rate and still durability thereof was similar to those of the example No. 5.

In addition to the examples No. 4 and No. 6, each of iso-butane and iso-pentane was examined as an example of branched saturated hydrocarbon. And it was observed that the deposition rate and still durability thereof have similar tendency to those of the examples No. 4 and No. 6.

In addition to the example No. 7, each of 2,4-dimethyl-pentene, 4-methyl-1-pentene and 2,3-dinethyl-1-butene was examined as an example of branched unsaturated hydrocarbon. And it was observed that the deposition rate and still durability thereof were similar to those of the example No. 7.

Concerning normal chain unsaturated hydrocarbon, each of 1-octene and 1-hexane, 3-octene was examined as an example of normal chain unsaturated hydrocarbon, and it was observed that the result was similar to the example No. 7.

In addition to the example No. 8, each of toluene and hexane were examined respectively as an example of aromatic hydrocarbon, and it was observed that deposition rate and still durability thereof were as similar as the example No. 8.

Further in addition to the examples No. 9 and No. 10, each of 2,3-dimethyl-1,3-butadiene and benzene was examined as a case wherein only hydrocarbon is used, and it was observed that the deposition rate and the still durability were low. In order to increase the deposition rate and still durability, it was necessary to increase the a.c. voltage Vac as shown in the examples No. 9 and No. 10.

Figure 5:
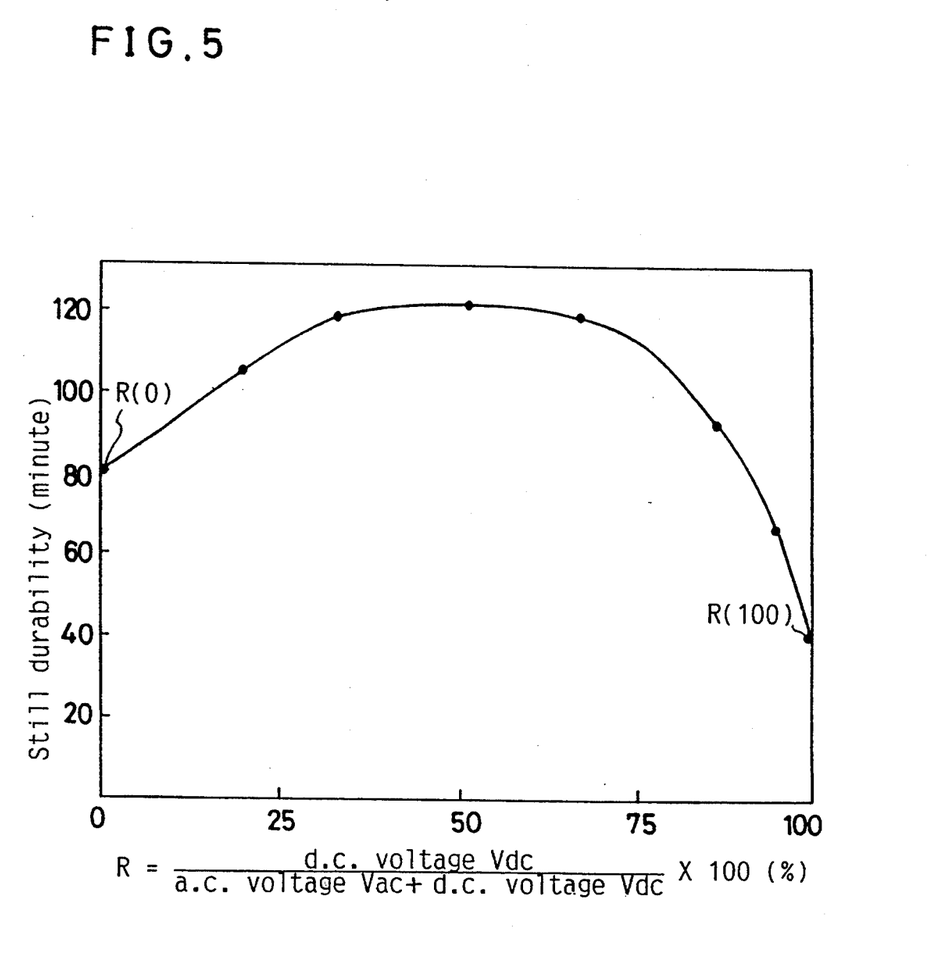
FIG. 5 is a diagram showing a relation between the still durability with the superimposed d.c. voltage Vdc.

FIG. 5 is a diagram showing a relation between the still durability with the superimposed d.c. voltage Vdc. Data in FIG. 5 are measured under the following condition:

the a.c. voltage has +2500 V peak voltage,
the frequency is 10 Hz,
plasma discharge is made under a mixed gas which consists of a 4:1 mixture of isooctane and argon, and
pressure in the discharge tube is 0.3 Torr.

In FIG. 5, an abscissa is graduated by a superimposing ratio R(%) which is defined by the following equation (1):

$$R = \frac{\text{d.c. voltage } V_{dc}}{\text{a.c. (effective) voltage } V_{ac} + \text{d.c. voltage } V_{dc}} \times 100(\%). \quad (1)$$

Therein, 100% of R means 0V of a.c. voltage Vac, that is, the point R(100) at R=100% means a data obtained by the conventional d.c. plasma CVD method. Comparison of this data with the point R(0) at R=0%, which means that only a.c. voltage Vac is applied, it is observed that a.c. plasma discharge of the present invention shows good still durability which is almost two times as large as one obtained by the conventional d.c. plasma discharge.

Further, in case the d.c. voltage Vdc in the range of 20%≦R≦70% is superimposed, most preferable good still durability, which is almost three times as large as the conventional data, is obtained.

Even if some conditions e.g. kind of material gas, pressure of gas, the a.c. voltage and/or the d.c. voltage are changed within the range where the diamond-like carbon film can be made, it was observed that the characteristic of the still durability against the superimposed d.c. voltage Vdc was similar as shown in FIG. 4. And further, even if the frequency of the a.c. voltage Vac is changed within the range from 80 Hz to 200 kHz, similar data as shown in FIG. 4 is obtained.

Next, the lubricant film 5 is formed by the conventional coater, or by the organic deposition method. The inventors made various organic film including fluorine as the lubricant film 5 on the typical diamond-like carbon film 6 of the present invention which is made under the same condition as the example No. 4 shown in Table 1. And the inventors found the afore-mentioned organic compound shows sufficient still durability as the lubricant film.

Hereafter some working examples thereof including their data as to still durability and reduction of head contamination are elucidated.

Three working examples of afore-mentioned composition A (partially fluorinated ester of alkyl carboxylic acid) are as follows:

example No. 11:  $C_6F_{11}OC_6H_4(CH_2)_{11}COOC_{10}H_{21}$,
example No. 12:  $C_5F_{11}(CH_2)_{10}COOC_8H_{17}$, and example No. 13:  
$$\begin{array}{c} C_6F_5 \\ \phantom{C_6F_5}\diagdown \\ \phantom{C_6F_5}\phantom{xx}CH(CH_2)_{15}-\underset{|}{\overset{CH_3}{CH}}-COOC_6H_{13}. \\ \phantom{C_6F_5}\diagup \\ C_6F_5 \end{array}$$

Layers of the above-mentioned compound were respectively formed 40 Å thick and are cut into ½ inch VTR tape.

Similarly, five working examples of afore-mentioned composition B (partially fluorinated alkyl carboxylic acid) are as follows;

example No. 14:  $HCF_2C(CF_2)_9(CH_2)_7COOH$,
example No. 15:  $C_5F_{11}(CH_{12})_{10}COOH$,
example No. 16:  $C_6F_5CH_2CH=CH(CH_2)_{14}COOH$,
example No. 17:  $C_9F_{17}O(CH_2)_{20}COOH$, and -continued example No. 18: $C_{16}H_{33}CH-COOH$
                       |
                   $C_8F_{17}OCO$ Layers of the above-mentioned compound were respectively formed 40 Å thick and are cut into 1½ inch VTR tape.

After repeating 300 times of running of these VTR tape example Nos. 11 to 18 for 30 minute followed by a pause by using the afore-mentioned M-II type VTR under the condition of 5° C.—80% RH, the amount of the head contamination was measured. In order to measure the amount of the head contamination numerically, the amount was classified and expressed by numerical values from 0 to 10 in a manner that higher contaminations were given larger number.

Further, after the above-mentioned 300 times runnings, the still durabilities of the examples Nos. 11 to 18 were measured respectively under the environmental condition of 5° C., 80% RH. Obtained data as to the amount of the head contamination and the still durability are shown in Table 2.

II. The magnetic recording medium further having a lubricant film made of
(a) partially fluorinated ester of alkyl carboxylic acid having melting point below 5° C. or
(b) partially fluorinated alkyl carboxylic acid having melting point from 50° C. to 90° C.

Although the elucidation has been made as to the metal thin film type deposition tape which has polyethylene terephthalate as the substrate for example, the present invention is applicable to a metal thin film type perpendicular (magnetic recording) tape having the substrate of polyimide and the like. Further in case the above-mentioned continuous production process for tape is changed to a batch type one, the present invention is also usable in production of a magnetic disc such as floppy disc or the like.

Although the invention has been described in preferred form with a certain degree of particularity, it is understood that the present disclosure of the preferred form has been changed in the details of construction and the combination and arrangement of parts may be resorted to without departing from the spirit and the scope of the invention as hereinafter claimed.

TABLE 2

| Example No. | Lubricant Molecular formula | Melting point | Head contamination | Still durability (minute) 5° C. 80% RH |
|---|---|---|---|---|
| 11 | $C_6F_{11}OC_6H_4(CH_2)_{11}COOC_{10}H_{21}$ | 2° C. | 1 | 50 |
| 12 | $C_5F_{11}(CH_2)_{10}COOC_8H_{17}$ | 20° C. | 5 | 55 |
| 13 | $C_6F_5$<br>$\phantom{xx}\searrow$CH$(CH_2)_{15}$CHCOOC$_6$H$_{13}$<br>$C_6F_5\phantom{xxxxxxx}$ | 5° C. | 3 | 70 |
| 14 | $HCF_2(CF_2)_9(CH_2)_7COOH$ | 85° C. | 2 | 40 |
| 15 | $C_5F_{11}(CH_2)_{10}COOH$ | 80° C. | 2 | 40 |
| 16 | $C_6F_5CH_2CH=CH(CH_2)_{14}COOH$ | 50° C. | 2 | 70 |
| 17 | $C_9F_{17}O(CH_2)_{20}COOH$ | 110° C. | 6 | 30 |
| 18 | $C_{16}H_{33}CH-COOH$<br>$\phantom{xxxxx}\|$<br>$\phantom{xxx}C_8F_{17}OCO$ | 50° C. | 1 | 70 |

From the data shown in Tables 1 and 2, and FIGS. 3, 4 and 5, the following conclusion was obtained:

The below-mentioned magnetic recording medium shows improved still durability and a decreased head contamination:

I. A magnetic recording medium having a diamond-like carbon film
(1) formed by plasma discharge of;
(1-a) a.c. voltage Vac in the frequency range of 80 Hz to 200 kHz, and has peak voltage of more than +500 V, or
(1-b) the same a.c. voltage Vac (defined in (1-a)) superimposed by the d.c. voltage at a superimposing ratio R(%), wherein $$R = \frac{\text{d.c. voltage } Vdc}{\text{a.c. (effective) voltage } Vac + \text{d.c. voltage } Vdc} \times 100(\%)$$

and $$20\% \leq R \leq 70\%$$

(2) and formed by a plasma CVD in a gas of
(2-c) only hydrocarbon having at least 3 carbon atoms, or
(2-d) hydrocarbon mixed with inert gas e.g. argon, and

What is claimed is:
1. A magnetic recording tape comprising:
a ferromagnetic metal thin film formed on a protrusion layer comprising $10^4-10^8$ particles/mm² on a substrate,
a polymer film formed on said ferromagnetic metal thin film,
a diamond-like carbon film with a Vickers hardness in a range of 3000–3500 kg/mm² formed on said polymer film by plasma CVD method utilizing a.c. power (voltage Vac) in the frequency range of 80 Hz to 200 kHz which has peak voltage more than +500 V and hydrocarbon having at least 3 carbon atoms as material gas and d.c. power which superimposes on said a.c. power at a superimposing ratio R(%) of

$$R = \frac{\text{d.c. voltage } Vdc}{\text{a.c. (effective) voltage } Vac + \text{d.c. voltage } Vdc} \times 100(\%)$$

and $20\% \leq R \leq 70\%$
and said plasma CVD method further utilizes one inert gas selected from the group consisting of helium, neon, argon, krypton, xenon, radon, and
a lubricant film consisting of:
partially fluorinated alkyl carboxylic acid having a melting point from 50° C. to 90° C., on said diamond-like carbon film.

* * * * *